United States Patent
Pun et al.

(10) Patent No.: US 11,553,598 B2
(45) Date of Patent: *Jan. 10, 2023

(54) INTEGRATED ELECTRO-OPTICAL FLEXIBLE CIRCUIT BOARD

(71) Applicant: Compass Technology Company Limited, Shatin (HK)

(72) Inventors: Kelvin Po Leung Pun, Shatin (HK); Chee Wah Cheung, Kowloon (HK); Jason Rotanson, Kowloon (HK)

(73) Assignee: Compass Technology Company Limited, Shatin (HK)

( * ) Notice: Subject to any disclaimer, the term of this patent is extended or adjusted under 35 U.S.C. 154(b) by 0 days.

This patent is subject to a terminal disclaimer.

(21) Appl. No.: 17/352,562

(22) Filed: Jun. 21, 2021

(65) Prior Publication Data
US 2021/0315108 A1    Oct. 7, 2021

Related U.S. Application Data

(63) Continuation of application No. 16/654,503, filed on Oct. 16, 2019, now Pat. No. 11,076,491.

(51) Int. Cl.
*H05K 1/00* (2006.01)
*H05K 3/36* (2006.01)
(Continued)

(52) U.S. Cl.
CPC ........... *H05K 3/361* (2013.01); *H05K 1/028* (2013.01); *H05K 1/141* (2013.01); *H05K 1/147* (2013.01);
(Continued)

(58) Field of Classification Search
CPC ........ H05K 3/361; H05K 1/028; H05K 1/141; H05K 1/147; H05K 2201/045; H05K 2201/055
(Continued)

(56) References Cited

U.S. PATENT DOCUMENTS 5,625,734 A    4/1997 Thomas
6,910,812 B2   6/2005 Pommer et al.
(Continued)

FOREIGN PATENT DOCUMENTS

CN    106658946 A    5/2017
KR    100821289 B1   4/2008

OTHER PUBLICATIONS

PCT International Search Report, Application No. PCT/CN2020/000251, Applicant's Reference: PC2010016TW, dated Jan. 20, 2021, 11 pages.
U.S. Office Action, U.S. Appl. No. 16/654,503, Applicant: Pun et al., dated Nov. 23, 2020, 17 pages.
Notice of Allowance, U.S. Appl. No. 16/654,503, Applicant: Pun et al., dated Apr. 2, 2021, 12 pages.

*Primary Examiner* — Andargie M Aychillhum
(74) *Attorney, Agent, or Firm* — Saile Ackerman LLC; Stephen B. Ackerman; Rosemary L. S. Pike

(57) ABSTRACT

An integrated electro-optical circuit board comprises a first flexible substrate having a top side and a bottom side, at least one first optical circuit on the bottom side of the first flexible substrate connected to the top surface through a filled via, at least one first metal trace on the top side of the first flexible substrate, an optical adhesive layer connecting the bottom side of the first flexible substrate to a top side of a second flexible substrate, and at least one second metal trace on a bottom side of the second flexible substrate connected by a filled via through the second flexible substrate, the optical adhesive layer, and the first flexible substrate to the at least one first metal trace.

20 Claims, 3 Drawing Sheets

(51) Int. Cl.
*H05K 1/02* (2006.01)
*H05K 1/14* (2006.01)

(52) U.S. Cl.
CPC . *H05K 2201/045* (2013.01); *H05K 2201/055* (2013.01)

(58) Field of Classification Search
USPC ......................................................... 361/749
See application file for complete search history.

(56) References Cited

U.S. PATENT DOCUMENTS

| | | |
|---|---|---|
| 9,110,200 B2 | 8/2015 | Nichol et al. |
| 9,130,254 B1 | 9/2015 | Izadian |
| 10,089,516 B2 | 10/2018 | Popovich et al. |
| 10,219,366 B1 | 2/2019 | Tseng et al. |
| 10,775,561 B2 | 9/2020 | Meister et al. |
| 11,076,491 B2 | 7/2021 | Pun et al. |
| 2009/0100671 A1 | 4/2009 | Kim et al. |
| 2009/0297096 A1 | 12/2009 | Hodono |
| 2016/0099214 A1 | 4/2016 | Dalal |
| 2016/0147345 A1 | 5/2016 | Lee |
| 2016/0356961 A1 | 12/2016 | Hu |
| 2018/0138346 A1 | 5/2018 | Simavoryan et al. |
| 2018/0226014 A1 | 8/2018 | Komanduri et al. |

INTEGRATED ELECTRO-OPTICAL FLEXIBLE CIRCUIT BOARD

This application is a continuation application of Ser. No. 16/654,503, filed on Oct. 16, 2019, which is herein incorporated by reference in its entirety and assigned to a common assignee.

TECHNICAL FIELD

This application relates to integrated circuit boards, and more particularly, to integrating optical circuits with electrical circuit boards.

BACKGROUND

To support future devices of high speed and high volume data transmission such as high performance computing (HPC), optical interconnect is the technology of choice. The conventional electrical circuit with copper interconnect is no longer viable due to its data bandwidth limitation and signal integrity issue. Optical interconnect offers numerous advantages for high performance devices. It enables a massive data transmission rate at lower attenuation/loss, latency, and power dissipation while being virtually immune to electromagnetic interference and noise. Meanwhile, electrical interconnect is more suitable for power distribution and signal processing and control. Electrical interconnect is also a mature technology with well-established infrastructure in the industry, hence it offers a significant cost advantage.

In recent years, flexible electronics have emerged as a promising solution for device miniaturization as it provides numerous advantages including higher circuitry density, thinner profile, lighter weight, and shape conformance capability (foldable and bendable) as compared to its rigid counterpart of printed circuit board (PCB). For even higher circuit density, multi-layer circuitry are utilized in which the circuits between layers are connected through via holes filled with signal carrying material.

By integrating optical interconnect with electrical interconnect into in a single package, advantages of both system can be realized. This is an attractive solution to accommodate complex and demanding technical requirements of high performance devices such as supercomputers, internet of things (IoTs), telecommunication networks, image detection, smart display, etc.

However, combining both interconnect systems to achieve a compact packaging module poses enormous challenges from a material and processing perspective. In optical circuits, the optical signal is transmitted through a core material that has to be fully enclosed by a cladding material. As the optical signal is transmitted based on the principle of total internal reflection, the refractive index of the core material has to be higher than the refractive index of the cladding material. The core, which acts as a waveguide to carry the optical signal, is typically made of silicon, III-V, glass or other polymer materials. In the electrical circuit, the electronic signal is typically transmitted through copper traces in between insulating dielectric material. As previously mentioned, the formation of an electrical interface has been well established in which copper is deposited, patterned, and etched on top of a dielectric surface which is typically flexible polyimide material to form the circuitry. With the significantly different requirements on each interface, a novel combination of material stack up is the key to achieving the integrated electro-optical flexible circuit board module. In this regard, glass emerges as an attractive material that is applicable for both optical and electrical interconnects due to its various unique properties. In an optical interface, glass is suitable as a cladding material for a wide range of core material owing to its relatively low refractive index. In an electrical interface, glass provides a superior insulation property with practically no dielectric loss for the copper trace and via interconnection. Glass also possesses excellent thermal stability with a coefficient of thermal expansion close to a mainstream semiconductor material such as silicon.

Various U.S. Patents discuss opto-electronic integration, optical adhesives, and cyclic olefin polymer. These include U.S. Pat. Nos. 6,910,812 (Pommer et al), 9,130,254 (Izadian), 9,110,200 (Nichol et al), and 10,089,516 (Popovich et al) and U.S. Patent Applications 2018/0138346 (Simavoryan et al) and 2018/0226014 (Komanduri et al).

SUMMARY

A principal object of the present disclosure is to provide a method of embedding an optical circuit onto a flexible electrical circuit.

Another object of the disclosure is to provide an integrated electro-optical flexible circuit board.

A further object of the disclosure is to provide an integrated electro-optical flexible circuit board packaged with both electrical and optical interconnects.

According to the objects of the disclosure, an integrated electro-optical flexible circuit board is achieved. The integrated electro-optical circuit board comprises a first flexible substrate having a top side and a bottom side, at least one first optical circuit on the bottom side of the first flexible substrate connected to the top surface through a filled via, at least one first metal trace on the top side of the first flexible substrate, an optical adhesive layer connecting the bottom side of the first flexible substrate to a top side of a second flexible substrate, and at least one second metal trace on a bottom side of the second flexible substrate connected by a filled via through the second flexible substrate, the optical adhesive layer, and the first flexible substrate to the at least one first metal trace.

Also according to the objects of the present disclosure, an integrated electro-optical flexible circuit board is achieved. The integrated electro-optical circuit board comprises a first flexible substrate having a top side and a bottom side, at least one first optical circuit on the bottom side of the first flexible substrate connected to the top surface through a filled via, at least one first metal trace on the top side of the first flexible substrate, an optical adhesive layer connecting the bottom side of the first flexible substrate to a top side of a second flexible substrate, and at least one second metal trace on a top side of the second flexible substrate and at least one third metal trace on a bottom side of the second flexible substrate connected by a filled via through the second flexible substrate to the at least one second metal trace.

Also according to the objects of the present disclosure, a method of fabricating an integrated electro-optical flexible circuit board is achieved. A first flexible substrate is provided having a top side and a bottom side. At least one first optical circuit is fabricated on the bottom side of the first flexible substrate and connected to the top surface through a first filled via. A 45° micro-mirror is fabricated between the first optical circuit and the first filled via. At least one first metal trace is fabricated on the top side of the first flexible substrate. A second flexible substrate is provided having a top side and a bottom side. The bottom side of the first flexible substrate is connected to a top side of a second flexible substrate with an optical adhesive layer. At least one second metal trace is fabricated on a bottom side of the second flexible substrate and connected to the at least one first metal trace by a second filled via through the second flexible substrate, optical adhesive layer, and first flexible substrate.

Also according to the objects of the present disclosure, an integrated electro-optical flexible circuit board is achieved. The integrated electro-optical circuit board comprises a first flexible substrate having a top side and a bottom side, at least one first optical circuit on the bottom side of the first flexible substrate connected to the top surface through a first filled via, at least one first metal trace on the top side of the first flexible substrate, an optical adhesive layer connecting the bottom side of the first flexible substrate to a top side of a second flexible substrate, at least one second metal trace on a top side of the second flexible substrate and at least one third metal trace on a bottom side of the second flexible substrate connected by a second filled via through the second flexible substrate to the at least one second metal trace, and a third flexible substrate with a bonding film between the second flexible substrate and the third flexible substrate wherein fourth and fifth metal traces are formed on and through the third flexible substrate and sixth and seventh metal traces are formed on and through the second flexible substrate.

Also according to the objects of the present disclosure, an integrated electro-optical flexible circuit board is achieved. The integrated electro-optical circuit board comprises a first flexible substrate having a top side and a bottom side, at least one first optical circuit on the bottom side of the first flexible substrate connected to the top surface through a first filled via, at least one first metal trace on the top side of the first flexible substrate, an optical adhesive layer connecting the bottom side of the first flexible substrate to a top side of a first half of a folded second flexible substrate, at least one second metal trace on a top side of the first half of the second flexible substrate and at least one third metal trace on a bottom side of first half of the second flexible substrate connected by a second filled via through the second flexible substrate to the at least one second metal trace, a bonding film joining the top side of a second half of the second flexible substrate to a top side of the first flexible substrate, and at least one third metal trace on a bottom side of the second half of the second flexible substrate connected by a third filled via to the at least one first metal trace.

BRIEF DESCRIPTION OF THE DRAWINGS

In the accompanying drawings forming a material part of this description, there is shown.

DESCRIPTION OF THE PREFERRED EMBODIMENTS

The present disclosure discloses several versions of integrated electro-optical flexible circuit boards (EOFCB). Features of these circuit boards include both electrical and optical circuits, flexible electronics, and glass material. Electrical circuits typically have low speed signals and are often used for power distribution, having lower circuit density. Optical circuits typically have high speed signals and higher circuit density. Flexible electronics have a small form factor and low profile. They typically have a high routing density and are foldable and bendable. Glass materials have smooth, transparent surfaces and low dielectric signal loss.

The concept of the present disclosure is to embed an optical circuit onto a flexible electrical circuit. Fabrication will be on the same glass substrate used for a flexible electrical circuit in order to provide superior isolation properties. An optical adhesive will be utilized to create a core-clad structure on a waveguide and surface modification will be utilized to directly metallize the glass surface with copper. The EOFCB of the present disclosure provides high coupling efficiency and low optical attenuation. Coupling efficiency refers to signal loss as it travels between different interfaces/mediums, while attenuation refers to signal strength degradation during transmission within an interface/medium.

The smooth glass surface of the substrate is suitable for thin film processing, minimizing transmission loss. There will be minimal dielectric loss on wiring and via routing because of the intrinsic properties of glass. There will be a significant size reduction with high density routing and multi-layer stack-up as well as module assembly process simplification, compared to separate optical and electronic modules that have to be interconnected by assembling them on conventional a printed circuit board (PCB). As these multiple assembly steps can be skipped, the overall process is simplified.

Figure 1:
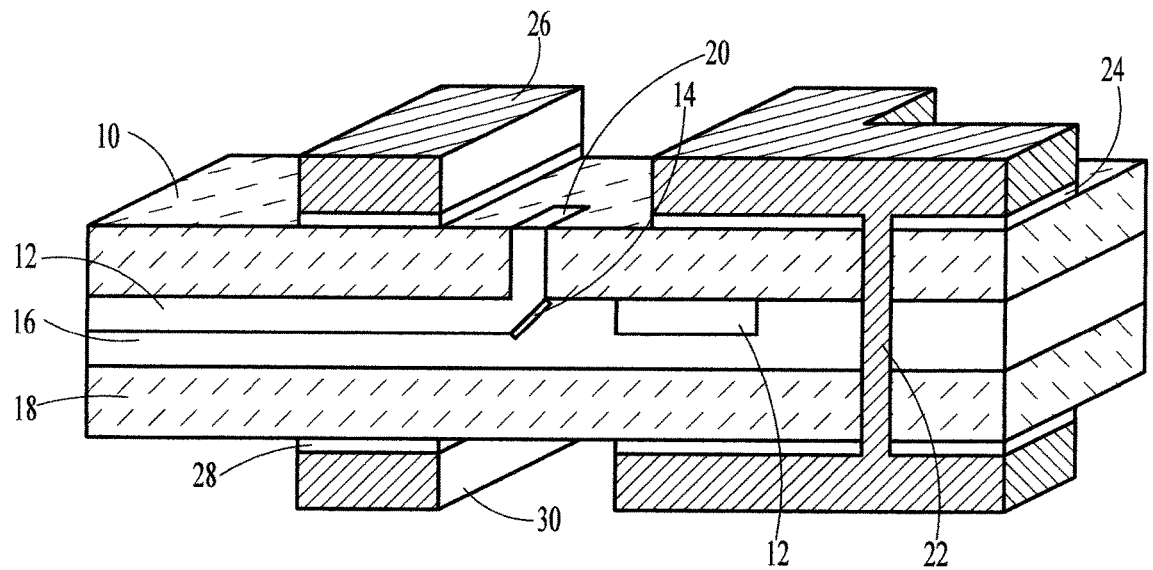
FIG. 1 is an isometric representation of a first preferred embodiment of the present disclosure.

Referring now more particularly to FIG. 1, the first preferred embodiment of the present disclosure will be described. A base film material of flexible glass 10 is provided. The glass substrate has a thickness range of between about 12.5 and 100 µm. Alternatively, the glass substrate could be replaced with cyclic olefin polymer (COP) for higher bendability and flexibility. A core waveguide material is deposited on the glass substrate 10. The refractive index of the waveguide material should be higher than the refractive index of the flexible glass substrate 10. Various alternatives for the waveguide material include silicon, silicon dioxide, gallium arsenide, gallium phosphide, and various polymer types, The thickness range of the waveguide material is between about 4 and 15 µm.

The waveguide material is patterned to form the optical circuit 12. A tapered geometry with angle of 45° is formed on the specific location of the waveguide sidewall. A 45° micro-mirror 14 is deposited on top of this tapered surface.

An optical adhesive material 16 is laminated onto the patterned waveguide optical circuit and base film 10. The optical adhesive must possess the exact same refractive index as that of the flexible glass material 10. Various alternatives for this optical adhesive material includes epoxies, polyurethanes, silicones elastomers, UV-cured acrylics, and Cyanoacrylates. The thickness range of the optical adhesive is between about 25 to 50 µm.

Now, a second layer 18 of the base film material, which can be flexible glass or cyclic olefin polymer (COP), is laminated onto the other side of the optical adhesive. The thickness of this second base film 18 ranges from between about 12.5 to 100 µm.

Through glass vias (TGV) 20 and 22 are formed through the designated interfaces. For the optical via 20, TGV is done only through the base film interface 10. The diameter of this TGV can be from 15 to 25 µm. A waveguide material is selectively deposited to fully fill the optical via 20.

The outside surfaces of both flexible glass substrates 10 and 18 are modified to form a Si oligomer structure followed by a Pd catalyst deposition which is held stable by pentagonal ring coordination. A circuit pattern is formed on the modified flexible glass surface to build up copper circuits as well as to fill the TGV 22 to connect one side of the circuit to the other. The thickness of the copper circuits can range from 4 to 15 µm. Electrical interfaces are formed on the outside surfaces of the glass or COP substrates 10 and 18. For example, a seed layer of Ni—P or copper, silver, or any type of metal alloy such as Nickel-Chromium may be formed on the outside surfaces of the substrates 10 and 18 and patterned as desired. Then copper traces may be plated on the seed layer. Seed layer 24 and copper traces 26 are shown on the outside surface of the substrate 10 and seed layer 28 and copper traces 30 are shown on the outside surface of substrate 18. Filled TGV 22 connects at least one of the copper traces 30 to at least one of the copper traces 26.

Figure 2:
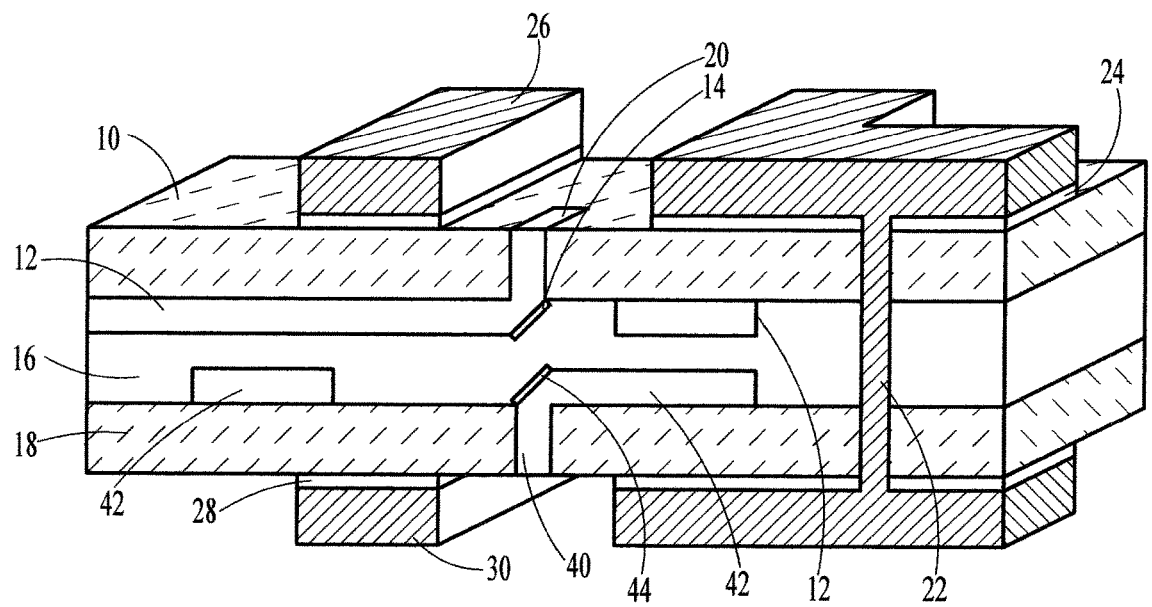
FIG. 2 is an isometric representation of a second preferred embodiment of the present disclosure.

FIG. 2 illustrates a second preferred embodiment of the present disclosure. As in the first embodiment, a base film material of flexible glass 10 is provided. The glass substrate has a thickness range of between about 12.5 and 100 µm. A core waveguide material is deposited on the glass substrate 10. The refractive index of the waveguide material should be higher than the refractive index of the flexible glass substrate 10. Various alternatives for the waveguide material include silicon, silicon dioxide, gallium arsenide, gallium phosphide, and various polymer types, The thickness range of the waveguide material is between about 4 and 15 µm.

The waveguide material is patterned to form the optical circuit 12. A tapered geometry with angle of 45° is formed on the specific location of the waveguide sidewall. A 45° micro-mirror 14 is deposited on top of this tapered surface.

In this embodiment, a second base film material of flexible glass 18 is provided having a thickness of between about 12.5 and 100 µm. A core waveguide material, identical to the waveguide material 12, is deposited on the second glass substrate 18. The waveguide material is patterned to form the second optical circuit 42. A tapered geometry with angle of 45° is formed on the specific location of the waveguide sidewall. A second 45° micro-mirror 44 is deposited on top of this tapered surface.

The glass substrates 10 and 18 are laminated together with an optical adhesive material 16. The optical circuits 12 and 42 face one another and are laminated in the optical adhesive. As above, the optical adhesive must possess the exact same refractive index as that of the flexible glass material 10 and 18. Various alternatives for this optical adhesive material includes epoxies, polyurethanes, silicones elastomers, UV-cured acrylics, and Cyanoacrylates. The thickness range of the optical adhesive is between about 25 to 50 µm.

The package is completed as in the first embodiment with through glass vias (TGV) 20 and 40 to the optical circuits 12 and 42, respectively, and TGV 22 connecting copper traces 26 on the first glass substrate 12 to copper traces 30 on the second glass substrate 18.

Figure 3:
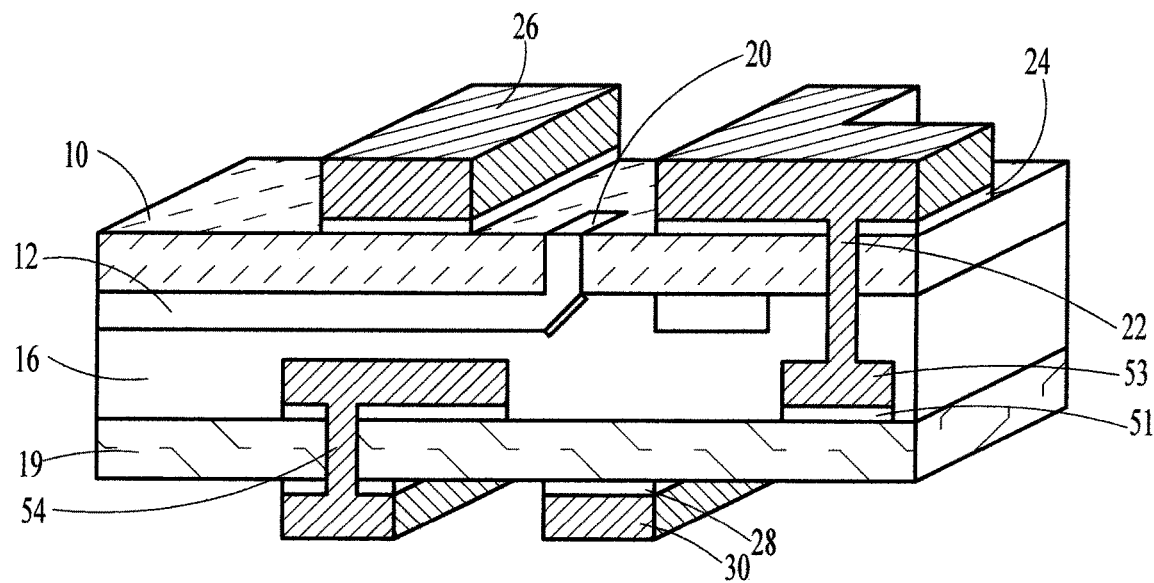
FIG. 3 is an isometric representation of a third preferred embodiment of the present disclosure.

In a third preferred embodiment of the present disclosure, as illustrated in FIG. 3, the second glass substrate 18 is replaced with polyimide (PI), modified polyimide (MPI), liquid crystal polymer (LCP), polyester (PET), polyethylene-naphtalate (PEN), poly tetra fluoro ethylene, or a laminate substrate such as epoxies and BT, or Teflon, or modified Teflon 19. The thickness of this second base film 19 ranges from 12.5 to 100 µm.

Optical circuits 12 and micro-mirror 14 are formed on the bottom side of the glass substrate 10. The outside surfaces of the second base film 19 are modified to form a polyamic acid (PAA) layer with a thickness range of 5-15nm, followed by a Pd catalyst deposition before forming the electrical circuits 53 with seed layer 51 on a top side of a substrate layer 19 and metal traces 30 with seed layer 28 on the bottom side of the substrate layer 19. Via connections 54 are made through the substrate 19 to connect at least one of the metal traces 53 on one side of the substrate 19 with at least one of the metal traces 30 on the opposite side of the substrate 19.

Figure 4:
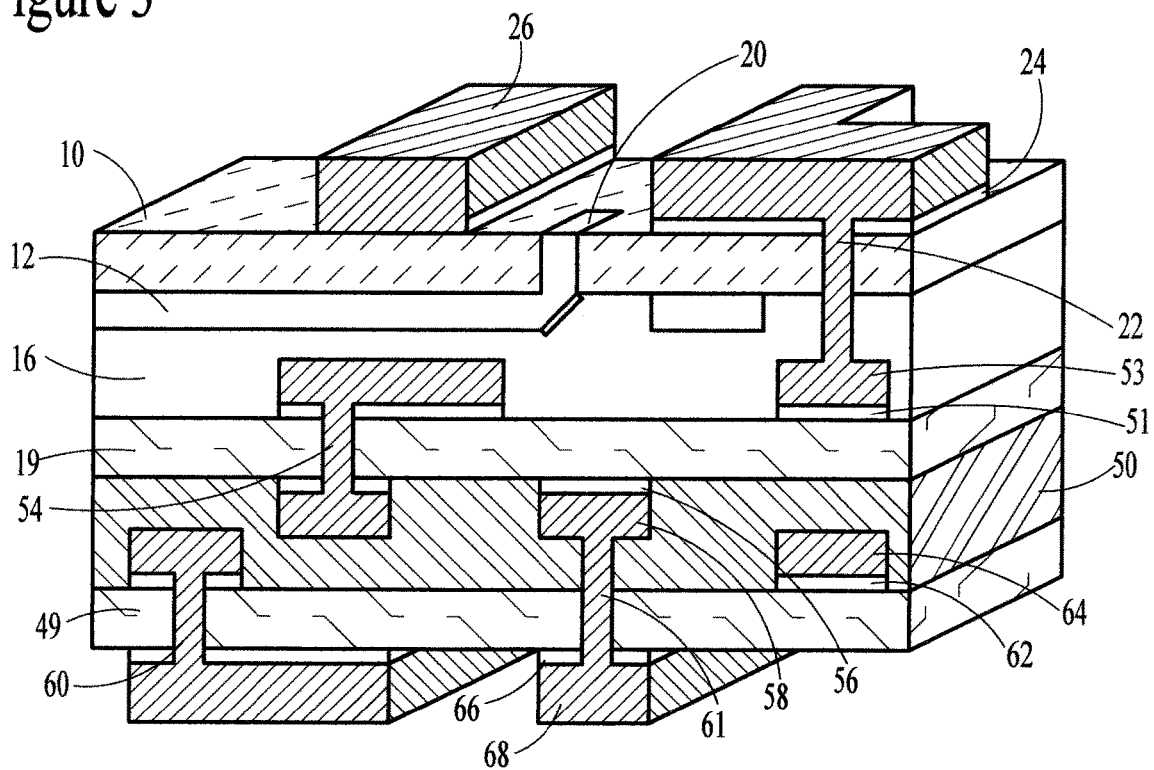
FIG. 4 is an isometric representation of a fourth preferred embodiment of the present disclosure.

FIG. 4 illustrates a fourth preferred embodiment of the present disclosure. This embodiment is similar to the third embodiment in which the second base substrate 18 is replaced with a polyimide (PI), modified polyimide (MPI), liquid crystal polymer (LCP), polyester (PET), polyethylene-naphtalate (PEN), poly tetra fluoro ethylene, or a laminate substrate such as epoxies and BT, or Teflon, or modified Teflon layer 19. In the fourth embodiment, instead of a single substrate layer 19, a multi-metal layer substrate of electrical interfaces is provided with a bonding film inserted in between the interfaces.

In the fourth preferred embodiment, optical circuits 12 and micro-mirror 14 are formed on the bottom side of the glass substrate 10. Metal traces 53 with seed layer 51 are formed on a top side of a substrate layer 19 and metal traces 58 with seed layer 56 are formed on the bottom side of the substrate layer 19. Via connections 54 are made through the substrate 19 to connect at least one of the metal traces 53 on one side of the substrate 19 with at least one of the metal traces 58 on the opposite side of the substrate 19. Likewise, metal traces 64 with seed layer 62 are formed on one side of a second substrate 49 comprising polyimide (PI), modified polyimide (MPI), liquid crystal polymer (LCP), polyester (PET), polyethylene-naphtalate (PEN), poly tetra fluoro ethylene, or a laminate substrate such as epoxies and BT, or Teflon, or modified Teflon layer. The two substrates 19 and 49 are laminated together with a bonding layer 50 between them. The bonding layer may be an adhesive film reinforced with fibers such as epoxy, cyanide ester, acrylic adhesive, modified polyimide (MPI) with epoxy, and so on, having a thickness in the range of between about 10 and 50 µm, and preferably about 25 µm.

The multi-metal layer substrate 19/50/49 is laminated to the base film substrate 10 with an optical adhesive 16, as described above. Now, the top and bottom vias and traces are formed. Through-glass vias 20 and 22 are formed Through substrate 10 and optical adhesive 16. A waveguide material is selectively deposited to fully fill the optical via 20. The outside surface of flexible glass substrate 10 is modified to form a Si oligomer structure followed by a Pd catalyst deposition which is held stable by pentagonal ring coordination. Electrical interfaces are formed on the outside surfaces of the glass substrate 10. For example, a seed layer of Ni—P or copper, silver, or any type of metal alloy such as Nickel-Chromium may be formed on the outside surface of the substrate 10 and patterned as desired. Then copper traces may be plated on the seed layer. Seed layer 24 and copper traces 26 are shown on the outside surface of the substrate. Filled TGV 22 connects at least one of the copper traces 26 to at least one of the copper traces 53 on bendable multi-metal substrate 19.

Likewise, via opeinings 60 and 61 are made through the base film 49 of the bendable multi-metal substrate and the bonding film 50. The outside surface of the outside base film 49 is modified to form a polyamic acid (PAA) layer with a thickness range of 5-15nm, followed by a Pd catalyst deposition before forming the electrical circuits 80 with seed layer 78 on the outside surface of the base film layer 49.

Figure 5:
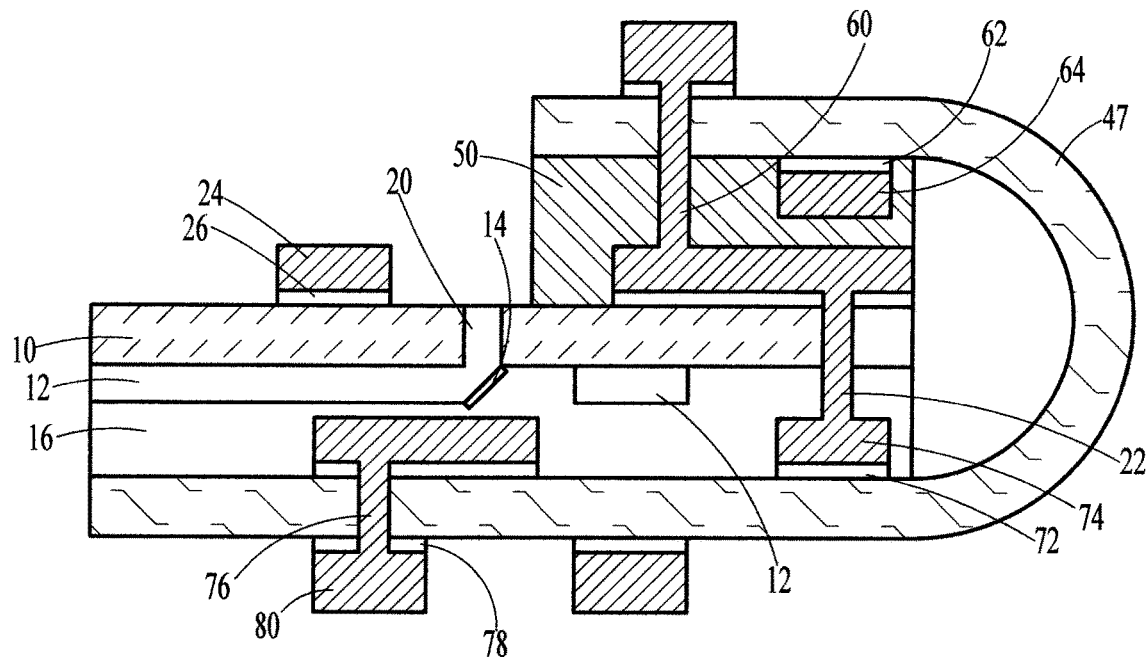
FIG. 5 is a cross-sectional representation of a fifth preferred embodiment of the present disclosure.

FIG. 5 illustrates a fifth preferred embodiment of the present disclosure. In this embodiment, there is a folded flexible polyimide substrate 47. A glass or COF substrate 10 lies between two ends of folded flexible substrate 47. On one surface of the substrate 10, on which a waveguide circuit 12 with micromirror 14 has been formed, an optical adhesive layer 14 joins the substrate 10 to the flexible substrate 47. On the opposite surface of substrate 10, a bonding film 50 joins the substrate 10 to an opposite arm of the flexible substrate 47.

Figure 6:
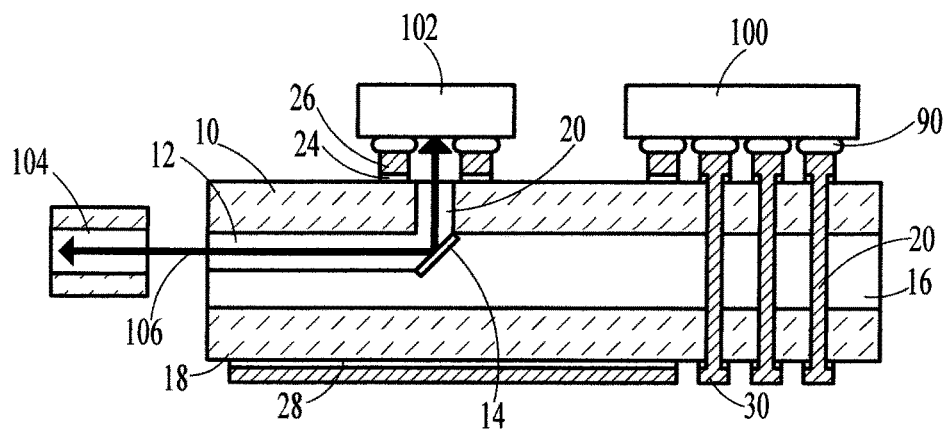
FIG. 6 is a cross-sectional representation of a completed package of the present disclosure.

FIG. 6 illustrates an integrated electro-optical flexible circuit board. The flexible circuit board is similar to that of FIG. 1 in the first embodiment. However, it will be understood that any of the first through fifth embodiments may be used in the fabrication steps now described. Electronic devices such as amplifier and driver integrated circuits 100 are mounted on top of copper traces 26 on one outside surface of the flexible circuit board. Optoelectronic devices 102 such as vertical-cavity surface-emitting laser (VCSEL) and photo detector (PD) modules are mounted on copper traces 26 on the same outside surface of the flexible circuit board. These devices 102 are aligned with the optical via 20. For example, the devices 100 and 102 may be mounted surface mount devices (SMD) 90 by surface mount technology (SMT) such as flip chip or wire bonding. Optical interface 104 is the waveguide (medium) for incoming signal 106 from any other module or outgoing signal from the module explained in this package construction.

The present disclosure has described various embodiments of an integrated electro-optical flexible circuit board. The EOFCB of the present disclosure provides high coupling efficiency and low optical attenuation as well as significant size reduction with high density routing and multi-layer stack up.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of fabricating an integrated electro-optical circuit board comprising:
    providing a first flexible substrate having a top side and a bottom side;
    fabricating at least one first optical circuit on said bottom side of said first flexible substrate and connecting said first optical circuit to said top surface through a first filled via;
    fabricating a 45° micro-mirror between said first optical circuit and said first filled via;
    fabricating at least one first metal trace on said top side of said first flexible substrate;
    providing a second flexible substrate having a top side and a bottom side;
    connecting said bottom side of said first flexible substrate to a top side of a second flexible substrate with an optical adhesive layer; and
    fabricating at least one second metal trace on a bottom side of said second flexible substrate and connecting said at least one second metal trace to said at least one first metal trace by a second filled via through said second flexible substrate, said optical adhesive layer, and said first flexible substrate.

2. The method according to claim 1 wherein said first flexible substrate comprises glass or cyclic olefin polymer (COP) having a thickness of between about 12.5 and 100 µm.

3. The method according to claim 1 wherein said at least one first optical circuit is a waveguide comprising silicon, silicon dioxide, gallium arsenide, gallium phosphide, or a polymer having a thickness of between about 4 and 15 µm and a refractive index higher than a refractive index of said first flexible substrate.

4. The method according to claim 1 wherein said optical adhesive material comprises epoxies, polyurethanes, silicones elastomers, UV-cured acrylics, or Cyanoacrylates having a thickness of between about 25 to 50 µm and a refractive index identical to a refractive index of said first flexible substrate.

5. The method according to claim 1 wherein said first and second metal traces comprise copper having a thickness of between about 4 and 15 µm and an underlying seed layer of Ni—P having a thickness of between about 0.01 and 0.5 µm.

6. The method according to claim 1 further comprising at least one second optical circuit on said top surface of said second flexible substrate.

7. The method according to claim 1 where said second flexible substrate comprises flexible glass or cyclic olefin polymer (COP) having a thickness of between about 12.5 and 100 µm.

8. The method according to claim 1 further comprising:
    mounting at least one electrical device onto said at least one first metal trace; and
    mounting at least one optoelectronic device onto said at least one first optical circuit.

9. An integrated electro-optical circuit board comprising:
    a first flexible substrate having a top side and a bottom side;
    at least one first optical circuit on said bottom side of said first flexible substrate connected to said top surface through a first filled via;
    at least one first metal trace on said top side of said first flexible substrate;
    an optical adhesive layer connecting said bottom side of said first flexible substrate to a top side of a second flexible substrate;
    at least one second metal trace on a top side of said second flexible substrate and at least one third metal trace on a bottom side of said second flexible substrate connected by a second filled via through said second flexible substrate to said at least one second metal trace; and
    a third flexible substrate with a bonding film between said second flexible substrate and said third flexible substrate wherein fourth and fifth metal traces are formed on and through said third flexible substrate and sixth and seventh metal traces are formed on and through said second flexible substrate.

10. The device according to claim 9 wherein said first flexible substrate comprises glass or cyclic olefin polymer (COP) having a thickness of between about 12.5 and 100 µm.

11. The device according to claim 9 wherein said at least one first optical circuit is a waveguide comprising silicon, silicon dioxide, gallium arsenide, gallium phosphide, or a polymer having a thickness of between about 4 and 15 µm and a refractive index higher than a refractive index of said first flexible substrate.

12. The device according to claim 9 further comprising a 45° micro-mirror between said first optical circuit and said filled via.

13. The device according to claim 9 wherein said optical adhesive material comprises epoxies, polyurethanes, silicones elastomers, UV-cured acrylics, or Cyanoacrylates having a thickness of between about 25 to 50 μm and a refractive index identical to a refractive index of said first flexible substrate.

14. The device according to claim 9 wherein said first, second, and third metal traces comprise copper having a thickness of between about 4 and 15 μm and an underlying seed layer of Ni—P having a thickness of between about 0.01 and 0.5 μm.

15. The device according to claim 9 wherein said second and third flexible substrates comprise polyimide (PI), modified polyimide (MPI), liquid crystal polymer (LCP), polyester (PET), polyethylene-naphtalate (PEN), poly tetra fluoro ethylene, or a laminate substrate such as epoxies and BT, or Teflon, or modified Teflon having a thickness of between about 12.5 and 100 μm.

16. An integrated electro-optical circuit board comprising:
- a first flexible substrate having a top side and a bottom side;
- at least one first optical circuit on said bottom side of said first flexible substrate connected to said top surface through a first filled via;
- at least one first metal trace on said top side of said first flexible substrate;
- an optical adhesive layer connecting said bottom side of said first flexible substrate to a top side of a first half of a folded second flexible substrate;
- at least one second metal trace on a top side of said first half of said second flexible substrate and at least one third metal trace on a bottom side of first half of said second flexible substrate connected by a second filled via through said second flexible substrate to said at least one second metal trace;
- a bonding film joining said top side of a second half of said second flexible substrate to a top side of said first flexible substrate; and
- at least one third metal trace on a bottom side of said second half of said second flexible substrate connected by a third filled via to said at least one first metal trace.

17. The device according to claim 16 further comprising:
- at least one electrical device mounted onto said at least one first metal trace; and
- at least one optoelectronic device mounted onto said at least one first optical circuit.

18. The device according to claim 16 wherein said first flexible substrate comprises glass or cyclic olefin polymer (COP) having a thickness of between about 12.5 and 100 μm and wherein said second flexible substrate comprises polyimide (PI), modified polyimide (MPI), liquid crystal polymer (LCP), polyester (PET), polyethylene-naphtalate (PEN), poly tetra fluoro ethylene, or a laminate substrate such as epoxies and BT, or Teflon, or modified Teflon having a thickness of between about 12.5 and 100 μm.

19. The device according to claim 16 wherein said at least one first optical circuit is a waveguide comprising silicon, silicon dioxide, gallium arsenide, gallium phosphide, or a polymer having a thickness of between about 4 and 15 μm and a refractive index higher than a refractive index of said first flexible substrate.

20. The device according to claim 16 wherein said optical adhesive material comprises epoxies, polyurethanes, silicones elastomers, UV-cured acrylics, or Cyanoacrylates having a thickness of between about 25 to 50 μm and a refractive index identical to a refractive index of said first flexible substrate.

* * * * *